United States Patent
Konishi

(10) Patent No.: US 10,069,516 B2
(45) Date of Patent: Sep. 4, 2018

(54) COMMUNICATION DEVICE, COMMUNICATION SYSTEM, AND ERROR CORRECTION FRAME GENERATION METHOD

(71) Applicant: MITSUBISHI ELECTRIC CORPORATION, Chiyoda-ku (JP)

(72) Inventor: Yoshiaki Konishi, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 76 days.

(21) Appl. No.: 15/126,825

(22) PCT Filed: Apr. 23, 2014

(86) PCT No.: PCT/JP2014/061487
§ 371 (c)(1),
(2) Date: Sep. 16, 2016

(87) PCT Pub. No.: WO2015/162738
PCT Pub. Date: Oct. 29, 2015

(65) Prior Publication Data
US 2017/0093432 A1    Mar. 30, 2017

(51) Int. Cl.
*H03M 13/15* (2006.01)
*H03M 13/33* (2006.01)
*H03M 13/00* (2006.01)

(52) U.S. Cl.
CPC ......... *H03M 13/15* (2013.01); *H03M 13/333* (2013.01); *H03M 13/616* (2013.01)

(58) Field of Classification Search
CPC ... H03M 13/15; H03M 13/616; H03M 13/333
See application file for complete search history.

(56) References Cited

U.S. PATENT DOCUMENTS 6,868,514 B2    3/2005 Kubo et al.
8,205,123 B2 *  6/2012 Yang ................... G06F 12/0207
                                                714/701
(Continued)

FOREIGN PATENT DOCUMENTS

JP    2001-168734 A    6/2001
JP    2003-069535 A    3/2003
(Continued)

OTHER PUBLICATIONS

D. Oh and K. K. Parhi, "Area efficient controller design of barrel shifters for reconfigurable LDPC decoders," 2008 IEEE International Symposium on Circuits and Systems, Seattle, WA, 2008, pp. 240-243.*

(Continued)

*Primary Examiner* — Cynthia Britt
(74) *Attorney, Agent, or Firm* — Oblon, McClelland, Maier & Neustadt, L.L.P.

(57) ABSTRACT

A communication device includes a barrel shifter shifting an information sequence according to a code word number; an error correction coding circuit encoding the shifted information sequence to generate a code word; and a transmitter transmitting a frame with N rows and M columns in the order of the row numbers. One code word is disposed in a row of the frame. The row number of the frame corresponds to the code word number. When a code word number is N, the error correction coding circuit encodes an information sequence of a second size smaller than the first size and fixed data of a third size, which is the difference between the first size and the second size, and disposes them in a row of the frame such that the error correction parity follows the information sequence of the second size and the fixed data follows the error correction parity.

6 Claims, 5 Drawing Sheets

(56) References Cited

U.S. PATENT DOCUMENTS

| | | | |
|---|---|---|---|
| 8,495,475 B2 | 7/2013 | Kubo et al. | |
| 8,621,316 B2 * | 12/2013 | Miyata | H03M 13/271 |
| | | | 714/701 |
| 9,148,175 B2 | 9/2015 | Miyata et al. | |
| 9,608,768 B2 * | 3/2017 | Liu | H04L 1/0079 |
| 9,788,244 B2 * | 10/2017 | Dinan | H04L 5/0053 |
| 2004/0170201 A1 | 9/2004 | Kubo et al. | |
| 2012/0246537 A1 | 9/2012 | Kubo et al. | |

FOREIGN PATENT DOCUMENTS

| | | | |
|---|---|---|---|
| JP | 2006-295510 A | 10/2006 | |
| JP | 2010-263555 A | 11/2010 | |
| JP | 2012-186521 A | 9/2012 | |
| WO | 2011/068045 A1 | 6/2011 | |
| WO | 2012/164929 A1 | 12/2012 | |

OTHER PUBLICATIONS

International Search Report and Written Opinion dated Jul. 29, 2014 in PCT/JP2014/061487 filed Apr. 23, 2014.
ITU-T G. 709/ Y. 1331 "Interfaces for the optical transport network" Oct. 2013 (Total 12 pages).
Choi, et al. "Concatenated Non-Binary LDPC and HD-FEC Codes for 100Gb/s Optical Transport Systems" Circuits and Systems (ISCAS), IEEE International Symposium on, May 23, 2012 (Total 5 pages).

* cited by examiner

COMMUNICATION DEVICE, COMMUNICATION SYSTEM, AND ERROR CORRECTION FRAME GENERATION METHOD

FIELD

The present invention relates to a communication device, a communication system, and an error correction frame generation method.

BACKGROUND

The introduction of mobile fronthaul, in which an antenna device is separated from a baseband signal processing device, is about to get underway in order to efficiently operate macrocell base stations in mobile communication systems. The Common Public Radio Interface (CPRI) is one of the de facto standards for a wired signal line connecting the two above devices. As traffic from wireless terminals such as smartphones increases, greater capacity is also required for the optical transmission links connecting antenna devices and baseband signal processing devices, and a method of efficiently multiplexing and transferring CPRI signals while maintaining signal quality including delay and error performance is also required.

The Optical Transport Network (OTN), which is a transmission standard for optical communications, can accommodate a wide variety of client, signals. The OTN can also increase the transmission quality of a signal by adding parity for error correction.

To alleviate the effects of burst errors that occur due to the concentration of signal errors in long-distance optical transmission, the OTN standard supports interleaving that transmits error correction-coded code words by turns to prevent the concentration of errors in a code word. Non Patent Literature 1, for example, shows a method of applying interleaving to an Optical channel Transport Unit (OTU) frame in Annex A.

CITATION LIST

Non Patent Literature

Non Patent Literature 1: ITU-T G.709/Y.1331 "Interfaces for the optical transport network"

SUMMARY

Technical Problem

A standard error correction system in the OTN specified in Recommendation G.709 (see Non Patent Literature 1) uses a 16-byte interleaved Reed-Solomon (RS) (255, 239) code. An RS code (n, k) code represents an RS code with a total of n number of bytes for code words and k number of information bytes. In this system, 16 code words consisting of 255 bytes are transmitted and received on a byte-by-byte basis. Because sorting of data by interleaving and signal processing in accordance with a forward error correction (FEC) frame format are performed, as the processing time to transmit a single code word, a time for a quarter of the Optical Transport Unit (OTU) frame is required. This, for example, corresponds to a delay of about 3 µsecs for an OTU2 signal with a signal rate of 10.7 Gbps.

However, a low delay of 1 µsec or less in, for example, a CPRI signal is required by a transmitting device applied to mobile fronthaul. Therefore, it is necessary to shorten the frame format by reducing the number of interleaving stages. In this case, the necessity to process continuous data means that, parallelization of error correction circuits is also necessary, resulting in a problem in that the circuit size is increased.

Further, in the 10 G-Passive Optical Network (PON) specified in the Institute of Electrical and Electronic Engineers (IEEE) 802.2av, 233-byte data containing 29 bits of value 0 is transmitted by an RS (255, 233) code without an interleaving operation. In the 10 G-PON, an idle period can be provided by removing one bit in 64 bits of a 64B/66B-encoded code word from error correction for alignment in a parallel data path. While this system is suitable for a 10 G-PON system that handles burst data, it is not suitable for an OTN that handles continuous data.

The present invention has been made in view of the above and has an object of providing a communication device, a communication system, and an error correction frame generation method capable of reducing delays while reducing the circuit size.

Solution to Problem

In order to solve the above problems and achieve the object, an aspect of the present invention is a communication device including: a transmitting-side shift unit that shifts an information sequence according to a code word number; an error correction coding circuit that encodes an information sequence shifted by the transmitting-side shift unit to generate a code word; and a transmitter that transmits a frame with N rows and M columns, where N and M are natural numbers, in order of row numbers, wherein one code word is disposed in a row of the frame, and the row number of the frame corresponds to the code word number, when a code word number associated with an information sequence to be encoded is not N, the error correction coding circuit encodes an information sequence of a first size and disposes the information sequence of the first size and error correction parity of the information sequence in a row of the frame such that the error correction parity follows the information sequence, and when a code word number associated with an information sequence to be encoded is N, the error correction coding circuit encodes an information sequence of a second size smaller than the first size and fixed data of a third size, which is a difference between the first size and the second size, and disposes the information sequence of the second size, error correction parity of the information sequence, and the fixed data in a row of the frame such that the error correction parity follows the information sequence of the second size and the fixed data follows the error correction parity.

Advantageous Effects of Invention

The communication device, the communication system, and the error correction frame generation method according to the present invention achieve an effect of being able to reduce delays while reducing the circuit size.

DESCRIPTION OF EMBODIMENTS

Hereinafter, an embodiment of a communication device, a communication system, and an error correction frame generation method according to the present invention will be described in detail with reference to the drawings. This invention is not limited to this embodiment.

Embodiment

Figure 1:
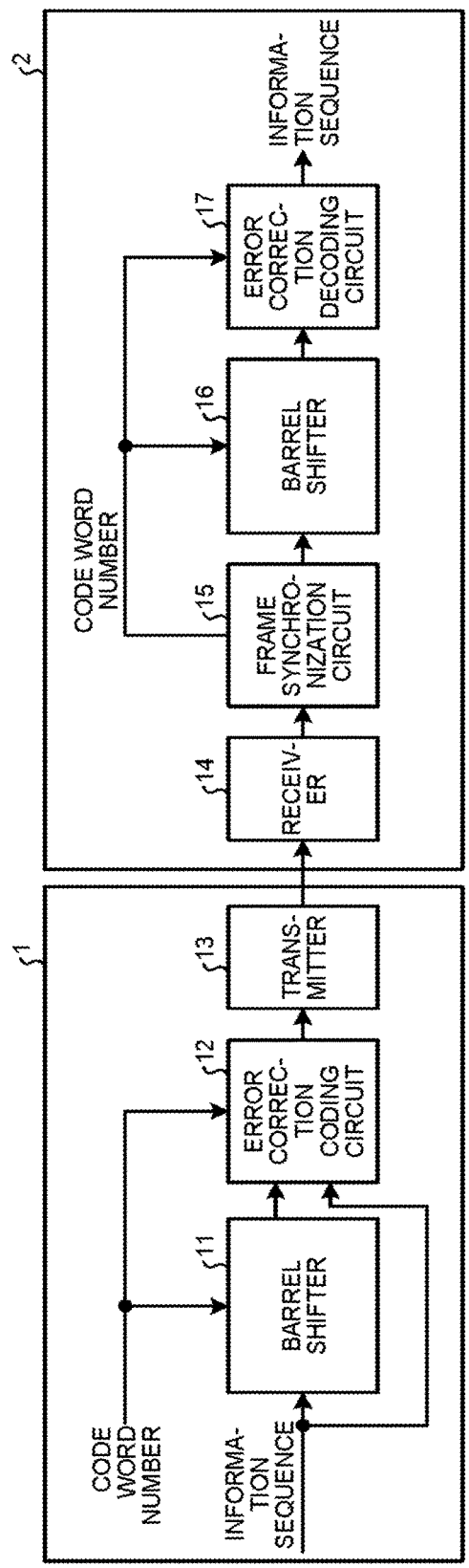
FIG. 1 is a diagram illustrating an example configuration of a communication system, according to the present invention.

FIG. 1 is a diagram illustrating an example configuration of an embodiment of the communication system according to the present invention. As illustrated in FIG. 1, the communication system in the present embodiment includes a transmitting device 1 and a receiving device 2. The present embodiment is described with the transmitting device 1 and the receiving device 2 as examples of the communication device according to the present invention. In FIG. 1, an example of one-way communication is described. When similar communication is performed bidirectionally, one communication device has both a function as the transmitting device 1 and a function as the receiving device 2.

As illustrated in FIG. 1, the transmitting device 1 includes a barrel shifter 11 (transmitting-side shift unit), an error correction coding circuit 12, and a transmitter 13. The barrel shifter 11 and the error correction coding circuit 12 are configured by a parallelized digital circuit.

An information sequence to be transmitted is input to the barrel shifter 11 as a parallel signal. A code word number indicating the number of the code word to which the information sequence is encoded is also input to the barrel shifter 11. The barrel shifter 11 generates data to which the parallel signal is shifted on a parallel data according to the code word number, and outputs the generated shifted data and the original information sequence to the error correction coding circuit 12. The error correction coding circuit 12 generates a code word by performing error correction coding on the input information sequence according to the code word number and outputs the code word to the transmitter 13. The transmitter 13 converts the code word into an optical signal, a radio signal, or the like for transmission.

As illustrated in FIG. 1, the receiving device 2 includes a receiver 14, a frame synchronisation circuit 15, a barrel shifter 16 (receiving-side shift unit), and an error correction decoding circuit 17. The frame synchronization circuit 15, the barrel shifter 16, and the error correction decoding circuit 17 are configured by a parallelized digital circuit.

The receiver 14 receives a signal transmitted from the transmitting device 1, and performs predetermined receiving processing in order to output the signal to the frame synchronization circuit 15. When an optical signal is transmitted from the transmitting device 1, the receiver 14 converts the optical signal into an electrical signal in order to output it to the frame synchronization circuit 15. The frame synchronization circuit 15 receives a code word received from the transmitting device 1, identifies the frame boundary, and determines the code word number. The frame synchronization circuit 15 outputs the received code word to the barrel shifter 16 and outputs the code word number to the barrel shifter 16 and the error correction decoding circuit 17. The barrel shifter 16 shifts, on the basis of the code word number, the code word input from the frame synchronization circuit 15 on a parallel data path to output the code word to the error correction decoding circuit 17. The error correction decoding circuit 17 performs error correction processing on the code word according to the code word number to reconstruct and output the original information sequence.

Figure 2:
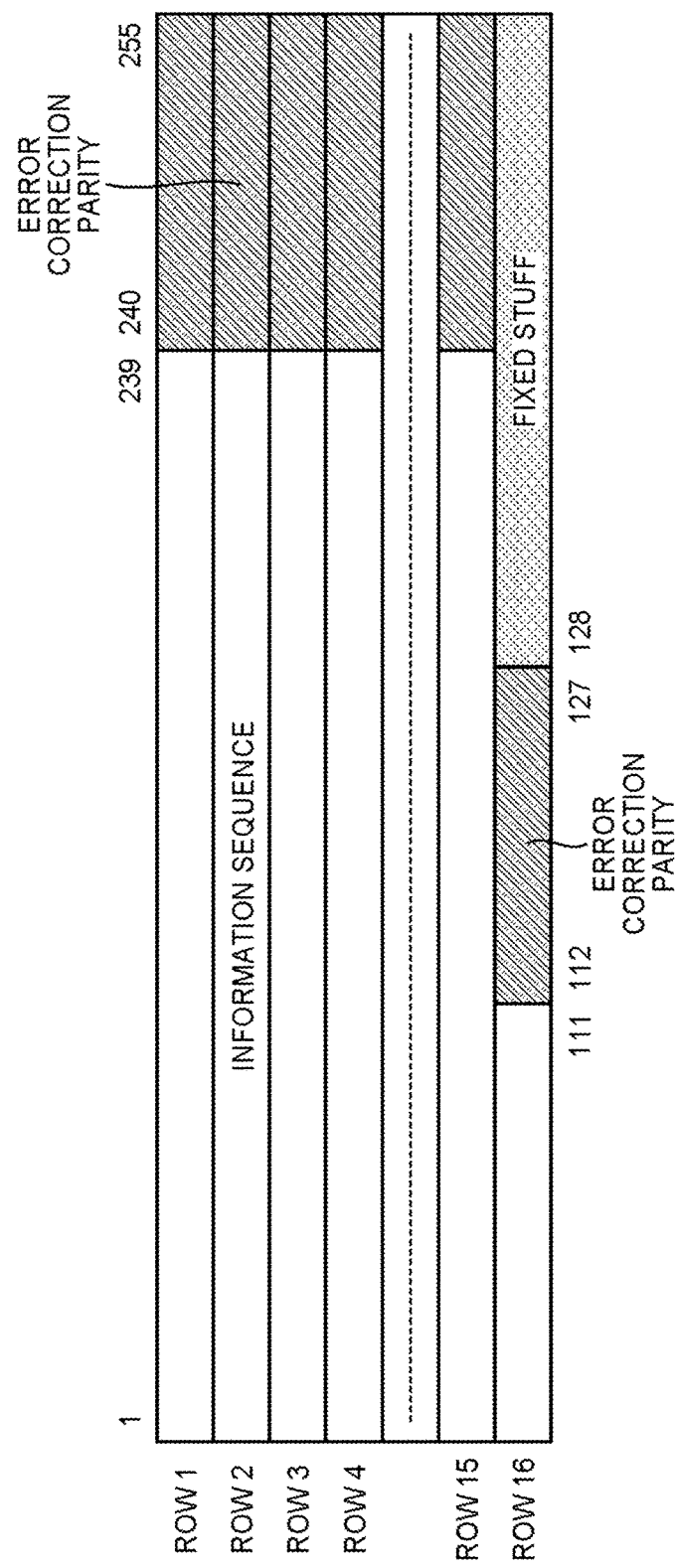
FIG. 2 is a diagram illustrating an example of a frame format of a frame used in a communication system in an embodiment.

FIG. 2 is a diagram illustrating an example of a frame format of a frame used in the communication system in the present embodiment. As illustrated in FIG. 2, the frame used in the communication system in the present embodiment is formed in bytes and is a frame of 16 rows×255 columns. In row 1 to row 15, an information sequence of 239 bytes (first size) is disposed in column 1 to column 239, and error correction parity is disposed in the last columns (column 240 to column 255). In row 16, an information sequence of 111 bytes (second size) is disposed in column 1 to column 111, error correction parity is stored in intermediate column 112 to column 127, and fixed stuff is disposed in the last columns (column 128 to column 255). In a fixed stuff region, any value may be stored. For example, data that is all "0" is stored.

One row in FIG. 2 represents one code word. Here, row 1 to row 15 are encoded with an RS (255, 239) code. Although encoding with the RS (255, 239) code is herein explained as an example, the encoding system is not limited to this. When codes other than the RS (255, 239) code are used and a fraction results from parallel processing performed on an information sequence, a technique of the present embodiment can be applied. The number of columns in a frame is determined on the basis of the size of the code word. The number of rows in the frame is determined on the basis of the size of the information sequence in one code word and the number of bits in the parallel data path. Here, there are 16 rows because a 128-bit parallel data path is used as described below, and the information sequence is 239 bytes. The number of bits in the parallel data path and the data size of the information sequence are not limited to these, and thus the number of rows in a frame is not limited to 16. The transmitter 13 sequentially transmits data in each row in FIG. 2 starting from row 1 in ascending order.

Figure 3:
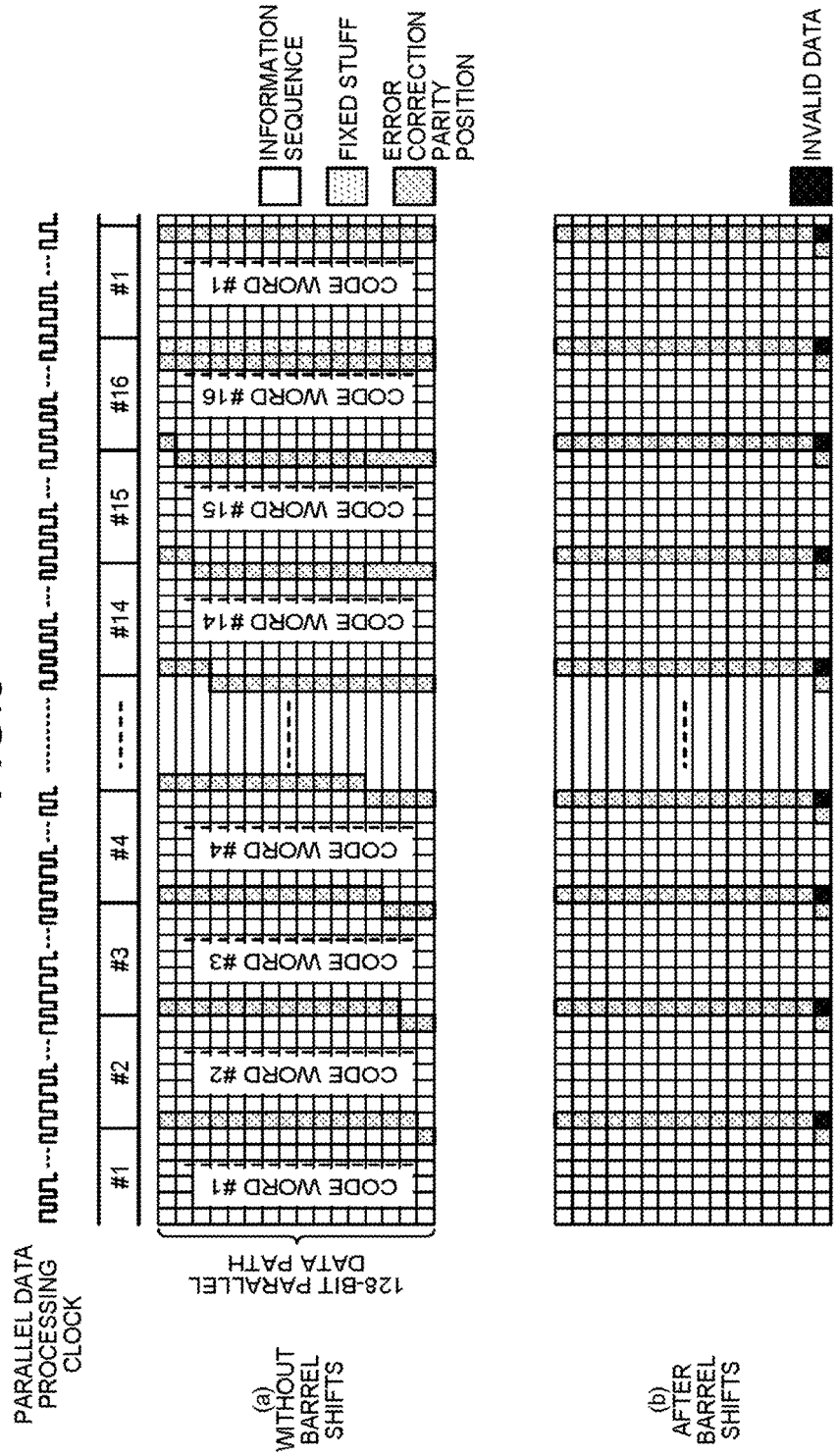
FIG. 3 is a diagram illustrating an example of data on a parallel data path in a transmitting device.

FIG. 3 is a diagram illustrating an example of data on the parallel data path in the transmitting device 1. FIG. 3(a) illustrates an example of the arrangement of code words: without, barrel shifts, and FIG. 3(b) illustrates an example of code words when barrel shifts are performed. In FIG. 3, one byte is represented by one rectangle, and rectangles without hatching represent information sequence. In FIG. 3(a), dark hatched rectangles represent the error correction parity position, and thin hatched rectangles represent fixed stuff. In FIG. 3(b), a black hatched portion represents invalid data.

In the upper first stage in FIG. 3, a parallel data processing clock is illustrated, and in the second stage, a clock group number for performing processing on a code word is illustrated. Here, it is assumed that a 128-bit parallel data path is used, and 128 bits (16 bytes) per pulse of the parallel data processing clock are arranged in a data path in parallel. As illustrated in. FIG. 2, the information sequence of a code word is 239 bytes, and 239 bytes are indivisible by 16 bytes. Specifically, 239=16×15−1, and thus at the fifteenth parallel data processing clock of a code word, the information sequence is 15 bytes, and the remaining one byte is assigned to the error correction parity. Therefore, without the barrel shifts illustrated in FIG. 3(a), the first code word agrees with the head of the parallel data path at the head of the information sequence, but the second code word is shifted one byte forward, and the head of the information sequence thereof does not agree with the head of the parallel data path. Further, the third code word is shifted two bytes forward, and the fourth code word is shifted three bytes forward. In this way, the sixteen code words are arranged such that they are individually shifted by one byte at a time.

When encoding processing is performed while this shifted state remains, the error correction, coding circuit 12 needs to process the sixteen code words shifted at the code word head by one byte at a time, which results in an increase in circuit size. In contrast, in the present embodiment, as illustrated in FIG. 3(*b*), the barrel shifter 11 shifts the second code word and thereafter by one byte at a time, such, as eight bits and sixteen bits, to match the head of the parallel data path and the heads of the information sequence of the code words. This allows the error correction coding circuit 12 to process information sequence arranged the same in the parallel data path regardless of the code word number. Therefore, the circuit size can be reduced when compared to the case of FIG. 3(*a*) where barrel shifts are not performed.

However, when the sixteenth code word is barrel-shifted, the last parallel, data processing clock associated with the sixteenth code word coincides with the first parallel data processing clock associated with the seventeenth code word. With the barrel shifts, in which a backward shift by one byte at a time is performed sixteen times, a data path of invalid data illustrated in FIG. 3(*b*) is produced. The invalid data agrees with the data size of one parallel data path, resulting in a shift of one clock compared to the case in FIG. 3(*a*). Thus, when the sixteenth code word is barrel-shifted as described above, the last parallel data processing clock associated with the sixteenth code word coincides with the first parallel data processing clock associated with the seventeenth code word. Consequently, the sixteenth code word and the seventeenth code word cannot be encoded simultaneously. Therefore, if this remains unchanged, two error correction circuits are required.

In the present embodiment, the last 128 bits of the sixteenth code word (for one parallel data path) are set as fixed stuff bytes, and therefore encoding processing need not be performed on the last 128 bits. Consequently, the head clock of the seventeenth code word does not coincide with the last clock of the sixteenths code word.

The error correction coding circuit 12 regards the final 128 bits of the sixteenth code word as a fixed value (e.g. 0) to generate error correction parity. The error correction coding circuit 12 disposes the generated error correction parity in a predetermined position subsequent to the information sequence to be passed and outputs the information sequence to the transmitter 13.

Figure 4:
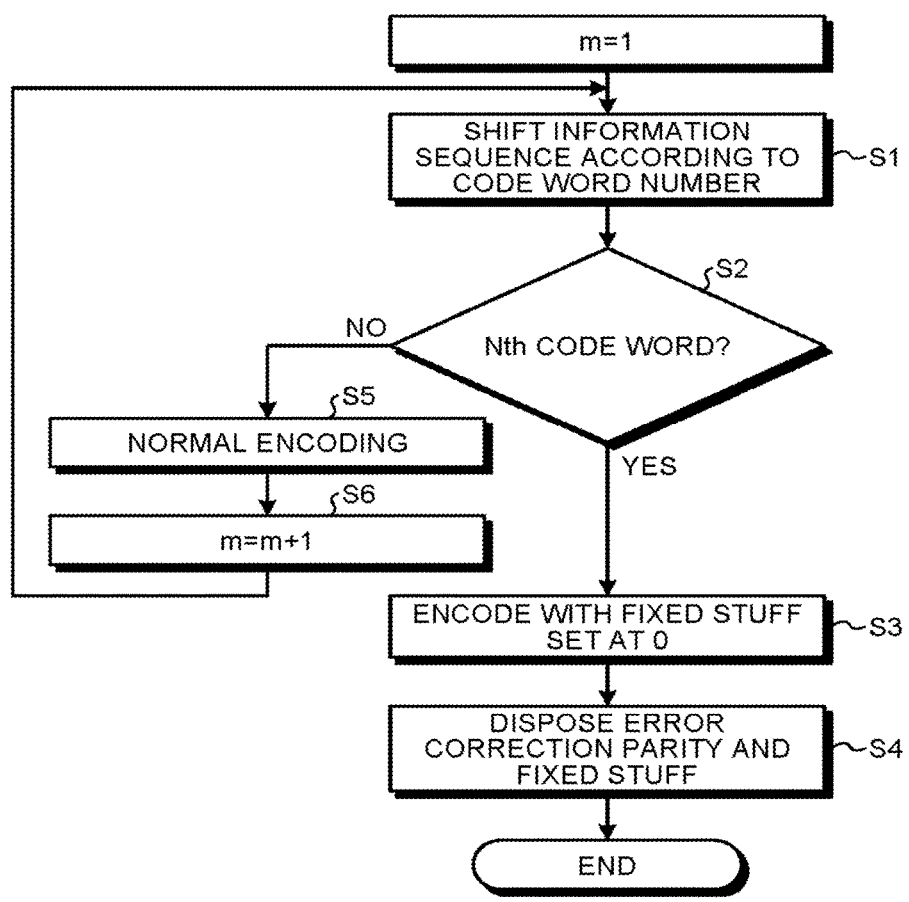
FIG. 4 is a diagram illustrating an example of a process for generating an error correction frame.

FIG. 4 is a diagram illustrating an example of a process for generating an error correction frame in the present embodiment. First, a code word number is initialized as m=1 to start the processing, and the barrel shifter 11 shifts an information sequence according to the code word number (step S1). The initialization and increment of the code word number is, for example, performed by a controller not illustrated for controlling the entire transmitting device 1. The controller inputs a code word number to the error correction coding circuit 12 and the barrel shifter 11. It is determined whether it is the Nth code word or not (step S2). N is, in the example of FIG. 3, 16, and it is typically the number of code words whose total shifted data size (invalid data size) amounts to the data size of one parallel data path.

When it is not the Nth code word (step S2 No), the error correction coding circuit 12 performs normal encoding (encodes only an information sequence) to generate error correction parity (step S5). m is incremented by one (step S6), and the process returns to step S1. When it is the Nth code word (step S2 Yes), the error correction coding circuit 12 encodes an information sequence input and data set at zero corresponding to the last fixed stuff to generate error correction parity (step S3). Then, the error correction coding circuit 12 disposes the error correction parity in a predetermined position subsequent to the information sequence to be passed, and inserts the fixed stuff last (step S4). With the above processing, one frame of data is generated. When the one frame (sixteen code words) of data is generated, the code word number is again initialized to one to be incremented to sixteen during the generation of the next frame.

Figure 5:
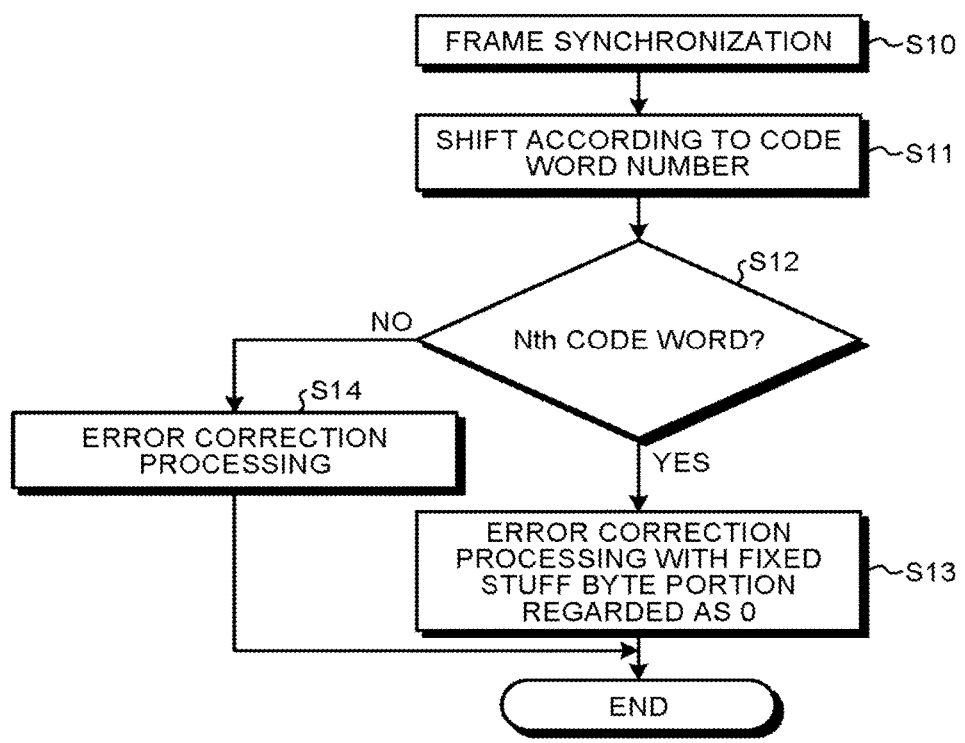
FIG. 5 is a diagram illustrating an example of an error correction decoding process.

FIG. 5 is a diagram illustrating an example of an error correction decoding process in the receiving device 2 in the present embodiment. In the receiving device 2, the frame synchronization circuit 15 performs frame synchronization processing to detect the head of a received frame (step S10). The frame synchronization circuit 15 extracts a code word number and notifies the barrel shifter 16 and the error correction decoding circuit 17 at later stages of the extracted code word number. A method of extracting a code word number, for example, can use the head of a frame detected as a reference to determine the code word number on the basis of the number of bits from the head. The barrel shifter 16 performs, according to a code word number, a barrel shift as on the transmitting side and aligns the head of the code word with the head of a 128-bit parallelized data path to output to the error correction decoding circuit 17 (step S11). The error correction decoding circuit 17 determines whether the code word number is N or not (step S12). When the code word number is N (step S12 Yes), the error correction decoding circuit 17 regards the last 128 bits as zero, and performs decoding processing to reconstruct, the original information sequence (step S13). When the code word number is not N (step S12 No), the error correction decoding (circuit 17 performs error correction processing to reconstruct the original information sequence (step S14).

As illustrated in FIG. 2, in a frame format in which a code word is put together in a short interval, the code word is not a multiple of 2 to the power of n (n is an integer) bytes. Therefore, there is a problem in that in a parallelized digital signal circuit, the head of a code word is shifted from the head of a parallelized digital signal, resulting in complicated coding and decoding circuits. However, in the present embodiment, for correction, a barrel shift is performed to align the head as needed, and, further, the final data of the last code word is set as a fixed stuff region, so that a single coding circuit (the error correction coding circuit 12) and a single decoding circuit (the error correction decoding circuit 17) can process the data of the next code word, which provides an effect whereby a low delay can foe achieved while reducing the circuit size.

INDUSTRIAL APPLICABILITY

As above, the communication device, the communication system, and the error correction frame generation method according to the present invention are useful for communication devices that perform error correction coding to transmit data, and, in particular, are suitable for communication devices that perform parallel processing.

REFERENCE SIGNS LIST

1 transmitting device, 2 receiving device, 11, 16 barrel shifter, 12 error correction coding circuit, 13 transmitter, 14 receiver, 15 frame synchronization circuit, 17 error correction decoding circuit.

The invention claimed is:

1. A communication device for communicating an information sequence to a receiving device, the communication device comprising:
a transmitting-side barrel shifter that receives the information sequence and a code word number, the transmitting-side barrel shifter not shifting the information sequence when the code word number is 1, and shifting the information sequence by one byte when the code word number is 2, the transmitting-side barrel shifter shifting the information sequence by a shift amount when the code word number is more than 2, the shift amount increasing from the one byte in one-byte increments as the code word number increases one-by-one from 2;
an error correction coding circuit that encodes an information sequence shifted by the transmitting-side barrel shifter to generate a code word to be included within a row of a frame, a row number of the frame corresponding to the code word number, the frame including N rows and M columns, where N and M are natural numbers,
when the code word number associated with the information sequence to be encoded is not N, the error correction coding circuit encodes the information sequence of a first size and disposes the information sequence of the first size and error correction parity of the information sequence in the row of the frame such that the error correction parity follows the information sequence, and
when the code word number associated with the information sequence to be encoded is N, the error correction coding circuit encodes the information sequence of a second size smaller than the first size and fixed data of a third size, which is a difference between the first size and the second size, and disposes the information sequence of the second size, error correction parity of the information sequence, and the fixed data in the row of the frame such that the error correction parity follows the information sequence of the second size and the fixed data follows the error correction parity; and
the communication device further comprising a transmitter that transmits the frame including the encoded information sequence to a receiving device in order of row numbers.

2. The communication device according to claim 1, wherein N is determined on a basis of a number of bits of a parallel data path in the error correction coding circuit and the first size.

3. The communication device according to claim 2, wherein
the number of bits of the parallel data path in the error correction coding circuit is 128 bits, N is 16, M is 255, and the first size is 239 bytes.

4. The receiving device that receives the frame transmitted from the communication device according to claim 1, the receiving device comprising:
a frame synchronization circuit that extracts a head of the frame received and a code word number;
a receiving-side barrel shifter that shifts a code word contained in the frame on a basis of the code word number; and
an error correction decoding circuit that performs error correction processing on a code word shifted by the receiving-side barrel shifter on a basis of the code word number.

5. A communication system comprising a transmitting device and a receiving device that receives a signal transmitted from the transmitting device, wherein
the transmitting device includes
a transmitting-side barrel shifter that receives the information sequence and a code word number, the transmitting-side barrel shifter not shifting. the information sequence when the code word. number is 1, and shifting the information sequence by one byte when the code word number is 2, the transmitting-side barrel shifter shifting the information sequence by a shift amount when the code word number is more than 2, the shift amount increasing from the one byte in one-byte increments as the code word number increases one-by-one from 2,
an error correction coding circuit that encodes an information sequence shifted by the transmitting-side barrel shifter to generate a code word to be included within a row of a frame, a row number of the frame corresponding to the code word number, the frame including N rows and M columns, where N and M are natural numbers,
when the code word number associated with the information sequence to be encoded is not N, the error correction coding circuit encodes the information sequence of a first size and disposes the information sequence of the first size and error correction parity of the information sequence in the row of the frame such that the error correction parity follows the information sequence,
when the code word number associated with the information sequence to be encoded is N, the error correction coding circuit encodes the information sequence of a second size smaller than the first size and fixed data of a third size, which is a difference between the first size and the second size, and disposes the information sequence of the second size, error correction parity of the information sequence, and the fixed data in the row of the frame such that the error correction parity follows the information sequence of the second size and the fixed data follows the error correction parity, and
the transmitting device further comprising a transmitter that transmits the signal including the frame that includes the encoded information sequence to the receiving device in order of row numbers,
the receiving device includes
a frame synchronization circuit that extracts a head of the frame received and a code word number,
a receiving-side barrel shifter that shift a code word contained in the frame on a basis of the code word number, and
an error correction decoding circuit that performs error correction processing on a code word shifted by the receiving-side barrel shifter on a basis of the code word number.

6. An error correction frame generation method, comprising:
shifting an information sequence according to a code word number;
shifting the information sequence by one byte when the code word number is 2:
shifting the information sequence by a shift amount when the code word number is more than 2, the shift amount increasing from the one byte in one-byte increments as the code word number increases one-by-one from 2:

encoding an information sequence shifted in the first step to generate a code word; and transmitting a frame with N rows and M columns, where N and M are natural numbers, from a transmitting device to a receiving device in order of row numbers, wherein one code word is disposed in a row of the frame, and the row number of the frame corresponds to the code word number, and the encoding includes, when the code word number associated with an information sequence to be encoded is not N, encoding the information sequence of a first size and disposing the information sequence of the first size and error correction parity of the information sequence in the row of the frame such that the error correction parity follows the information sequence, and, when the code word number associated with the information sequence to be encoded is N, encoding the information sequence of a second size smaller than the first size and fixed data of a third size, which is a difference between the first size and the second size, and disposing the information sequence of the second size, error correction parity of the information sequence, and the fixed data in the row of the frame such that the error correction parity follows the information sequence of the second size and the fixed data follows the error correction parity.

* * * * *